US00RE41733E

(19) United States
(12) Reissued Patent
Shepard

(10) Patent Number: US RE41,733 E
(45) Date of Reissued Patent: *Sep. 21, 2010

(54) DUAL-ADDRESSED RECTIFIER STORAGE DEVICE

(75) Inventor: Daniel R. Shepard, North Hampton, NH (US)

(73) Assignee: Contour Semiconductor, Inc., N. Billerica, MA (US)

( * ) Notice: This patent is subject to a terminal disclaimer.

(21) Appl. No.: 09/821,182

(22) Filed: Mar. 29, 2001

Related U.S. Patent Documents

Reissue of:

(64) Patent No.: 5,889,694
Issued: Mar. 30, 1999
Appl. No.: 08/863,156
Filed: May 27, 1997

U.S. Applications:

(63) Continuation-in-part of application No. 08/610,992, filed on Mar. 5, 1996, now Pat. No. 5,673,218.

(51) Int. Cl.
*G11C 17/06* (2006.01)

(52) U.S. Cl. ..... 365/105; 365/115; 365/175; 365/227; 365/239; 365/111; 365/230.09; 365/243; 345/82; 345/83

(58) Field of Classification Search ..... 365/175, 365/105, 115, 239, 227; 345/82, 83
See application file for complete search history.

(56) References Cited

U.S. PATENT DOCUMENTS

| | | | | |
|---|---|---|---|---|
| 2,709,042 A | | 5/1955 | Couffignal | |
| 3,091,754 A | | 5/1963 | Nazare | |
| 3,245,051 A | | 4/1966 | Robb | 365/96 |
| 3,308,433 A | | 3/1967 | Lochinger | |
| 3,373,406 A | | 3/1968 | Cannon et al. | |
| 3,626,389 A | | 12/1971 | Waaben | 365/175 |
| 3,701,119 A | * | 10/1972 | Waaben et al. | 365/175 |
| 3,721,964 A | | 3/1973 | Barrett et al. | |
| 3,806,896 A | * | 4/1974 | Mar | 365/105 |
| 3,838,405 A | | 9/1974 | Arnett et al. | 365/175 |
| 3,942,071 A | | 3/1976 | Krebs et al. | |
| 4,010,453 A | | 3/1977 | Lewis | |
| 4,070,654 A | | 1/1978 | Tachi | 365/104 |

(Continued)

FOREIGN PATENT DOCUMENTS

| | | | |
|---|---|---|---|
| DE | 10111454 A1 | | 9/2002 |
| JP | 57-203293 | * | 12/1982 |
| JP | 57-203294 | * | 12/1982 |
| JP | 2-98898 | * | 4/1990 |
| WO | 99/39394 | | 8/1999 |

OTHER PUBLICATIONS

International Search Report: International Application No. PCT/US 99/02239, mailed May 31, 1999.

(Continued)

*Primary Examiner*—Andrew Q Tran
(74) *Attorney, Agent, or Firm*—Goodwin Procter LLP

(57) ABSTRACT

A read-only data storage and retrieval device is presented having no moving parts and requiring very low power. Addressing can be accomplished sequentially where the address increments automatically or can be accomplished randomly. High density storage is achieved through the use of a highly symmetric diode matrix that is addressed in both coordinate directions; its symmetry makes the Dual-addressed Rectifier Storage (DRS) Array very [scaleable] *scalable*, particularly when made as an integrated circuit. For even greater storage flexibility, multiple digital rectifier storage arrays can be incorporated into the device, one or more of which can be made removable and interchangeable.

55 Claims, 8 Drawing Sheets

U.S. PATENT DOCUMENTS 4,090,190 A 5/1978 Rostkovsky et al.
4,240,151 A 12/1980 Kawagoe et al.
4,308,595 A 12/1981 Houghton
4,312,046 A 1/1982 Taylor ..... 365/104
4,322,822 A 3/1982 McPherson
4,342,102 A 7/1982 Puar
4,347,585 A 8/1982 Eardley ..... 365/105
4,385,368 A 5/1983 Principi et al. ..... 365/105
4,394,752 A 7/1983 Boudon et al.
4,404,480 A 9/1983 Ransom et al.
4,419,741 A 12/1983 Stewart et al.
4,442,507 A 4/1984 Roesner
4,479,200 A 10/1984 Sato et al.
4,525,921 A 7/1985 Carson et al.
4,534,008 A 8/1985 Fuchs et al.
4,554,640 A 11/1985 Wong et al.
4,561,070 A 12/1985 Armstrong
4,608,672 A * 8/1986 Roberts et al. ..... 365/230.04
4,646,128 A 2/1987 Carson et al.
4,646,266 A 2/1987 Ovshinsky et al.
4,661,927 A 4/1987 Graebel ..... 365/175
4,710,900 A 12/1987 Higuchi
4,721,885 A 1/1988 Brodie
4,757,475 A 7/1988 Awaya
4,772,886 A 9/1988 Hasegawa et al.
4,782,340 A 11/1988 Czubatyj et al.
4,800,529 A 1/1989 Ueno
4,845,679 A 7/1989 Vu
4,884,238 A 11/1989 Lee et al. ..... 365/105
4,920,516 A 4/1990 Tsuchimoto et al.
5,051,865 A 9/1991 Kato et al.
5,163,328 A 11/1992 Holland et al.
5,203,731 A 4/1993 Zimmerman
5,296,716 A 3/1994 Ovshinsky et al.
5,357,471 A 10/1994 Alapat
5,397,957 A 3/1995 Zimmerman
5,432,729 A 7/1995 Carson et al.
5,441,907 A 8/1995 Sung et al.
5,463,269 A 10/1995 Zimmerman
5,463,583 A 10/1995 Takashina
5,569,973 A 10/1996 Zimmerman
5,576,986 A 11/1996 Matsuzaki et al.
5,640,343 A 6/1997 Gallagher et al.
5,668,032 A 9/1997 Holmberg et al.
5,673,218 A * 9/1997 Shepard ..... 365/105
5,675,531 A 10/1997 McClelland et al.
5,719,589 A 2/1998 Norman et al.
5,835,396 A 11/1998 Zhang
5,837,564 A 11/1998 Sandhu et al.
5,840,608 A 11/1998 Chang
5,889,694 A * 3/1999 Shepard ..... 365/105
6,055,180 A 4/2000 Gudesen et al.
6,075,723 A 6/2000 Naiki et al.
6,117,720 A 9/2000 Harshfield
6,163,475 A 12/2000 Proebsting
6,185,122 B1 2/2001 Johnson et al.
6,198,682 B1 3/2001 Proebsting
6,236,587 B1 5/2001 Gudesen et al.
6,256,767 B1 7/2001 Kuekes et al. ..... 716/9
6,259,132 B1 7/2001 Pio
6,351,023 B1 2/2002 Gates et al.
6,385,075 B1 5/2002 Taussig et al. ..... 365/105
6,459,095 B1 10/2002 Heath et al.
6,462,998 B1 10/2002 Proebsting
6,478,231 B1 11/2002 Taussig ..... 235/492
6,552,409 B2 4/2003 Taussig et al. ..... 257/529
6,559,468 B1 5/2003 Kuekes et al.
6,567,295 B2 5/2003 Taussig et al. ..... 365/105
6,586,327 B2 7/2003 Shepard
6,587,394 B2 7/2003 Hogan
6,598,164 B1 7/2003 Shepard
6,613,650 B1 9/2003 Holmberg
6,721,223 B2 4/2004 Matsumoto et al.
6,744,681 B2 6/2004 Hogan
6,839,260 B2 1/2005 Ishii
6,956,757 B2 * 10/2005 Shepard ..... 365/100
7,054,219 B1 5/2006 Petti et al.
7,088,613 B2 8/2006 Lue et al.
7,149,934 B2 12/2006 Shepard
7,183,206 B2 2/2007 Shepard
7,190,602 B2 3/2007 Johnson et al.
7,330,369 B2 2/2008 Tran
7,376,008 B2 5/2008 Shepard
7,408,798 B2 8/2008 Bernstein et al.
7,460,384 B2 12/2008 Shepard
7,471,547 B2 12/2008 Schloesser
7,548,453 B2 6/2009 Nestler
7,548,454 B2 6/2009 Nestler
7,554,873 B2 6/2009 Lee et al.
7,593,246 B2 9/2009 Shepard
7,593,256 B2 9/2009 Nestler
2002/0126526 A1 9/2002 Taussig et al. ..... 365/175
2002/0184459 A1 12/2002 Taussig et al. ..... 711/165
2002/0191434 A1 12/2002 Taussig et al. ..... 365/105
2002/0192895 A1 12/2002 Taussig et al. ..... 438/237
2002/0196659 A1 12/2002 Hurst et al. ..... 365/175
2003/0003633 A1 1/2003 Mei et al. ..... 438/131
2003/0026120 A1 2/2003 Scheuerlein
2003/0028699 A1 2/2003 Holtzman et al.
2004/0145938 A1 7/2004 Tihanyi
2004/0160805 A1 8/2004 Rinerson et al.
2005/0067675 A1 3/2005 Shepard
2005/0127350 A1 6/2005 Furkay et al.
2006/0072427 A1 4/2006 Kanda et al.
2007/0028150 A1 2/2007 Shepard
2007/0242494 A1 10/2007 Nestler
2007/0247890 A1 10/2007 Shepard
2008/0013354 A1 1/2008 Shepard
2008/0016414 A1 1/2008 Shepard
2009/0109726 A1 4/2009 Shepard
2009/0141535 A1 6/2009 Yang et al.
2009/0161420 A1 6/2009 Shepard
2009/0225579 A1 9/2009 Shepard et al.
2009/0225621 A1 9/2009 Shepard
2009/0296445 A1 12/2009 Shepard

OTHER PUBLICATIONS

Berger, "Models for Contacts to Planar Devices," Solid–State Electronics, vol. 15 (1972), pp. 145–158.

Crawford et al., "An Improved Tunnel Diode Memory System," IBM Journal (Jul. 1963), pp. 199–206.

De Graaf et al., "A Novel High–Density Low–Cost Diode Programmable Read only Memory," IEEE IEDM, session 7.6.1 (1996), pp. 189–192.

Hodges et al., "Analysis and Design of Digital Integrated Circuits," McGraw–Hill Book Company, pp. 27–32.

Hurst, "A Survey of Published Information on Universal Logic Arrays," Microelectronics and Reliability, vol. 16, (1977), pp. 663–674.

International Search Report and Written Opinion in International Patent Application No. PCT/US2007/007792, mailed Oct. 30, 2007.

International Search Report and Written Opinion in International Patent Application No. PCT/US07/011020, mailed Jul. 18, 2008 (16 pages).

International Search Report and Written Opinion in International Patent Application No. PCT/US2008/075986, mailed Jan. 22, 2009 (13 pages).

International Search Report and Written Opinion in International Patent Application No. PCT/US2008/082503, mailed Feb. 25, 2009 (13 pages).

McConnell et al., "Diode–Transistor Logic, " Digital Electronics, Chapter 5, West Virginia Univ. (2002), pp. 1–14.

Near et al., "Read–only Memory Adds to Calculator's Repertoire," Electronics (Feb. 3, 1969), pp. 70–77.

Partial International Search Report in International Patent Application No. PCT/US07/011020, mailed Apr. 14, 2008, 6 pages.

"Summary Page: National Radio Institute 832," Old–Computers.com, http://old–computers.com/museum/computer.asp?c=884&st=1., (Apr. 4, 2007) 2 pages.

Wang et al., "High–Current–Density Thin–Film Silcone Diodes Grown at Low Temperature," Appiled Phys. Lett., vol. 85(11), pp. 2122–2224 (Sep. 13, 2004).

Wang et al., "Low–Temperature Thin–Film Silicon Diodes for Consumer Electronics," Mater. Res. Soc. Symp. Proc., vol. 862 (2005), pp. A15.5.1–A15.5.6.

* cited by examiner

DUAL-ADDRESSED RECTIFIER STORAGE DEVICE

Matter enclosed in heavy brackets [ ] appears in the original patent but forms no part of this reissue specification; matter printed in italics indicates the additions made by reissue.

CROSS-REFERENCE TO RELATED APPLICATION

*Notice: More that one reissue application has been filed for the reissue of U.S. Pat. No. 5,889,694. The reissue applications are: 09/821,182 (the present application) filed on Mar. 29, 2001, 11/780,220 filed on Jul. 19, 2007, and 11/780,300 filed on Jul. 19, 2007.* This application is a continuation in part of Application Ser. No. 08/610,992 entitled "Dual Addressed Rectifier Storage Device", filed Mar. 5, 1996, now U.S. Pat. No. 5,673,218, Sep 30, 1997.

BACKGROUND OF THE INVENTION

1. Field of the Invention

The present invention relates to electronic data retrieval devices, and more particularly to electronic digital logic devices having semiconductor mass storage capabilities by virtue of their data being stored in highly symmetrical arrays of diodes.

2. Prior Art

Most present day devices having mass storage capabilities rely on such moveable media as magnetic disks, optical compact disks, digital tape or the like. Some devices having large storage [Capabilities] *capabilities* have utilized large numbers of read-only memory (ROM) devices.

Many read-only memory (ROM) devices have been disclosed having a wide variety of implementations. In many of these devices the bit storage means is accomplished through the application of gates or transistors. But, a subset of these ROM devices has accomplished the bit[,] storage means through the use of a matrix of diodes, as was disclosed by Robb in U.S. Pat. No. 3,245,051. Many of these ROM device*s* [is] include diode matrix storage means utilizing a set of conductors that act as selectors and a second orthogonal set of conductors that act as data outputs.

In U.S. Pat. No. 4,070,654, one set of generally parallel conductors acts as the Selection Input Lines and a second set of generally parallel conductors that is orthogonal to and overlapping with the first acts as the Digit Output Lines. A bit of information is represented at each point of intersection of the Selection Input lines with the Digit Output Lines by the presence or absence of a diode at that point, where the presence or absence of a diode distinguishes the logical state of the stored information bit at that point of intersection. A selection circuit selects one line of the Selection Input Lines such that the state of all of the Digit Output Lines is then controlled to the extent that each of those Digit Output Lines is connected to that selected Selection Input Line through a diode. All of the [digit] *Digit* Output Lines are read in parallel. A disadvantage is that as the matrix is increased in size, the complexity of the selection logic that drives the selection circuits (such that one line is selected out of the many Selection Input Lines) grows exponentially. But as this matrix increases in size, so too will the number of Digit Output Lines that will have to be simultaneously supplied with current and that current will vary depending upon the state of the bits at those various locations. Also, as the number of simultaneously driven Digit Output Lines increases, some means of selecting the subset of desired data bits would have to be added.

In U.S. Pat. No. 4,661,927, some of the problems of the exponential growth in the complexity of the addressing circuitry and of the loading on the selected addressing lines are dealt with. Addressing is accomplished by using diode-transistor logic (DTL) for the input addressing. The transistors of the DTL selection circuits act as buffer-drivers between the address selection means and the bit storage means thereby providing the current needed to source a growing number of data bit output lines. However, the transistors in this DTL circuitry add complexity to the overall circuit which will reduce packing densities and add an additional problem—that of leakage currents in those transistors—that requires additional compensating circuitry that further reduces packing densities. The use of dummy diode loads for balancing data dependent loading variations reduces packing densities even further.

In U.S. Pat. No. 4,884,238, the problem of loading is dealt with by utilizing FET switches to disconnect all but the desired Digit Output line. The selected bit is present at the intersection of two selected orthogonal conducting lines. In this way, the number of bits simultaneously selected does not grow with the size of the array and the problem of loading can be controlled. But, such a design still requires a large number of FET transistors and the addressing means to control those FET transistors and the interconnection wiring to connect said addressing means with said FET transistors which will reduce packing densities. While the addressing means could be of the same DTL type to keep said addressing means small, the large number of buffering transistors to select the various conductive lines will remain large (at least one FET per conductive line and, on about half of the lines, two FET's). Furthermore, this inclusion of FET transistors may make the device subject to damage from static electrical discharges that might make it less practical for use in a consumer product where the consumer may handle these devices.

In U.S. Pat. No. 4,347,585, Eardley discloses a dual-addressed device wherein the selected diode is at the intersection of a column line and a row line (where the column lines are connected to the diodes' cathodes and the row lines are connected to the diodes' anodes) such that the voltage potential of one column line is lowered and the voltage potential of one row line is raised thereby forward biasing the diode, if any, at the point of intersection of the two lines. One of the features of this device over the prior art (as discussed in that patent) is the circuitry for the selection logic; Eardley discloses means for line selection comprising high speed transistor driver circuits. The disclosed device also requires two types of Schottky barrier diode devices. As a result, it is anticipated that the disclosed device will suffer from several problems, particularly when one attempts to scale up the device to extremely high storage densities. These problems may include transistor current leakage becoming noticeable as the number of transistors increases and device yields becoming reduced as the complexity of multiple semiconductor fabrication steps and [nore] *more* complex device interconnect circuitry increases. These problems may prevent the kind of size scaling that could result in devices in the Gigabit range that would be necessary to create memory chips that could replace today's CD-ROMs.

As will be shown below, the Dual-addressed Rectifier Storage (DRS) Array comprised by the present invention solves many of the [Problems] *problems* associated with the above mentioned inventions while s*us*taining high data packing densities by simultaneously using both orthogonal sets of conductors to address the data bits without the need for transistor switches on each conductive line. It does this by having a diode-logic addressing mechanism directly controlling the voltage levels on the conductive lines. Also, by extending the application of the diode array to perform the functions of addressing, storage, and bit sensing, symmetry is increased and this higher symmetry results in higher packing densities.

In U.S. Pat. No. 4,070,654, among others, a means is disclosed for programming the information into a semiconductor diode array by selectively etching away openings through the oxide layer that insulates the plurality of doped conductors from the orthogonal plurality of metalized conductors on the surface such that each opening enabled contact between the respective conductor of each plurality thereby forming a diode representing a toggled bit of stored information at that array location. The present invention discloses a means for constructing the semiconductor device up to the final metalization etch step before programming the data thereby enabling the programming of data to be performed much later in the manufacturing process.

Mass storage devices comprising moveable media such as magnetic disks, optical compact disks, digital tape, or the like, have motors and other mechanical parts that are prone to breaking or wearing out, can suffer audio disruption when subjected to vibrations, are too heavy to be carried during certain activities such as jogging, and consume significant electrical power (due to the operation of the mechanical components). Devices utilizing ROM chips are limited in their capacities due to the limited storage densities of present day ROM chips. The present invention eliminates or reduces all of these drawbacks because it uses DRS Arrays and, as a result, has the high storage densities of a CD-ROM without having mechanical parts.

SUMMARY OF THE INVENTION

Instead of a CD-ROM and its associated mechanical components, this device comprises one or more Dual-addressed Rectifier Storage (DRS) Arrays which are read-only memory (ROM) devices that utilize an array of rectifiers for its storage means. Like the predecessors to the DRS Array, the logical state of stored data is determined by the presence or absence of rectifiers at the points of intersection of two orthogonal and overlapping sets of generally parallel conductive lines. The present invention uses both sets of generally parallel conductive lines for addressing but senses the logical state of the addressed data by sensing the loading on the selected lines.

The DRS Array comprises a cross-point selection means that enables the selection of a single point of intersection from within an array by applying a forward voltage across that point; this selection means will find applications in Read Only Memory (ROM) as shown in the present device, One-Time Programmable Read Only Memory (OTPROM), Random Access Memory (RAM), and LED matrix displays.

More specifically, the DRS Array comprises an array of [Rectifiers] *rectifiers* (where the column lines are connected to the cathodes of said rectifiers and the row lines are connected to the anodes of said rectifiers) wherein the row lines and column lines are pulled through resistive means to either the positive supply or to ground, respectively, such that, absent any addressing circuitry, all of the rectifiers in the array would be forward biased. The addition of addressing circuitry will selectively connect those row lines and column lines to either ground or the positive supply such that the voltage potential between any row line and column line would be dropped to the point that an interconnected rectifier no longer would be forward biased. Any line whose voltage is pulled close to either ground or to the positive supply and away from that voltage that would result from the resistive means alone will be referred to as [Being] *being* "disabled."

Selection of a line in both sets of generally parallel lines is accomplished by a diode addressing array similar to that disclosed in U.S. Pat. No. 4,661,927 but, instead of using diode-transistor logic (DTL) means to do this addressing, no transistor buffer-driver stage is used, thereby greatly reducing circuit complexity while eliminating a source of possible current leaks. This is possible by taking advantage of the forward voltage drop characteristics of a rectifier to control the voltage levels. The present device does not attempt to drive a heavily loaded selected line (where all of the orthogonal output lines that are connected to the selected line through diodes comprise that loading) that might require such a buffer-driver stage; the only load is that rectifier connection to the selected orthogonal line. One result of this disabling means is a greatly simplified selection circuit on both orthogonal sets in the array. The addressing means, the storage means, and the bit sensing means are all formed in the same rectifier array structure in a highly simple and symmetric design that is ideal for high packing densities.

The present invention comprises DRS Arrays that could be removable and interchangeable so that one could pop them in and out according to their current musical interest or desire. A DRS Array is expected to be able to hold the equivalent of an entire CD-ROM or more on a single one inch (or smaller) square of silicon, unlike conventional read only memory chips (ROM's) which would require about 50 ROM chip*s* if each contained about 10 Megabytes of data. By contrast, the present invention would be very small and compact.

While most present day mass storage devices rely on such moveable media as magnetic disks, optical compact disks, digital tape or the like, the present invention, through the use of the DRS array, eliminates the mechanical components of such devices. In so doing, the present invention reduces the risk of mechanical failures, the problems of bulkiness, and the consumption of electrical power. The many possible variations on the DRS Array make it a very versatile storage medium ranging from a stand-alone array chip, to an array chip with an incorporated sequentially loaded address sequencer, to a microcomputer chip that utilizes the DRS Array for its program memory, to a personal stereo unit utilizing a removable DRS Array instead of a music CD-ROM, to a pocket sized video player utilizing a removable DRS Array module containing compressed video data.

DESCRIPTION OF THE PREFERRED EMBODIMENT

Figure 1:
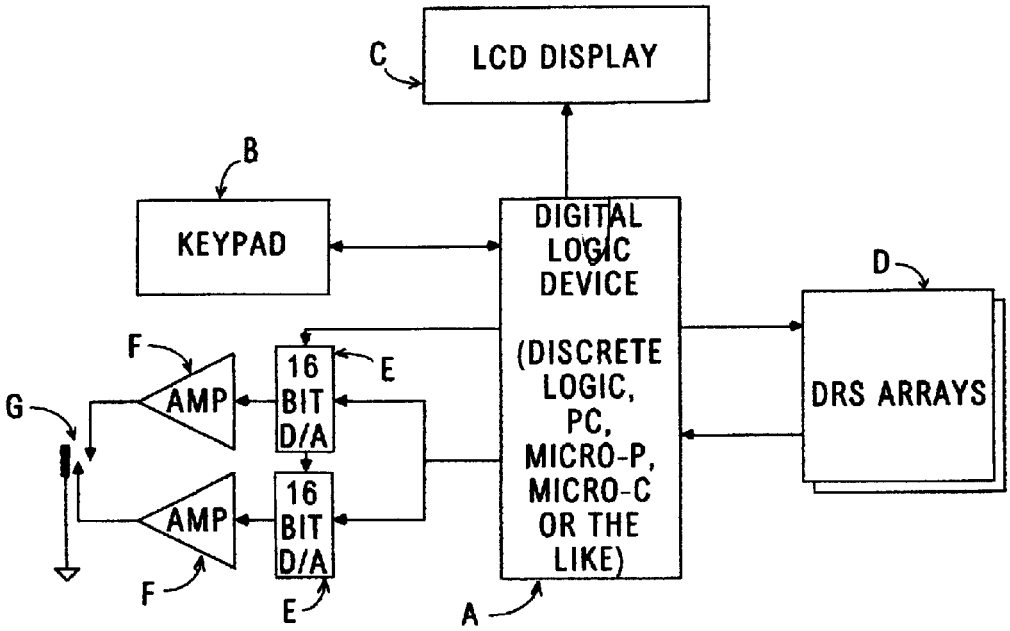
FIG. 1. illustrates a block diagram of a digital logic device comprising a Dual-addressed Rectifier Storage (DRS) Array, keypad, *L*CD display and dual analog outputs.

Refer now to the drawings which show a preferred embodiment of the invention. FIG. 1 shows a block diagram of a digital logic device comprising a microcomputer, a keypad, an LCD display, [analog to] digital *to analog* converters, analog buffers and amplifiers, a headphone jack, and a Dual-addressed Rectifier Storage (DRS) Array. Microcomputer, A, is connected to a keypad, B, and an LCD display, C. This configuration is very common and several of the manufacturers of microcomputer chips have application notes showing the details and schematics of such a circuit configuration. Microcomputer, A, is also interfaced to two 16 bit digital to analog converters, E, whose outputs are connected to circuitry, F, capable of driving a set of headphones (plugged into this device at the headphone jack, G). Circuitry such as this just described is known by one skilled in the art; this circuitry exists in essentially this form in many common devices, including portable CD-ROM audio players used for listening to music CD's.

Software running in the microcomputer, A, would cause that microcomputer to sequentially read 4 bytes of data from the DRS Array, D, every 25 μSec and move that data to the two 16-bit digital to analog converters, E. The result of this process would be 16 bit stereo sampled at 40 KHz thereby matching the audio of current CD-ROM technology. Software running in the microcomputer could also cause information read from the DRS Array (such as musical artist, title of the audio tracks, playing time, and the like) to be displayed on the LCD display. Software running in the microcomputer could also read from the keypad to affect the operation of that running software and cause it to jump to a specific address in the DRS Array at which point it would continue to read sequentially (such as to skip or repeat certain audio tracks, play the tracks contained in the DRS Array in random order, or the like).

The data contained in the DRS Array need not be limited to musical data. Video data, computer software or applications, reference data such as text, diagrams or the like, or a variety of other information could be stored. Of course, in many of these possible data types, the exact configuration as shown in FIG. 1 may not be needed. [for] *For* example, a DRS Array containing computer software would likely not need two digital to analog converters for output but would rather need interface logic such that it could be connected to a standard computer such that it emulated a standard CD-ROM drive. In this way, one could enjoy the benefits afforded by the use of DRS arrays without having to modify one's standard computer or its software (given an accurate emulation of a CD-ROM drive, that standard computer would operate just as if it was actually connected to a CD-ROM drive). What is needed is the ability to connect DRS Arrays to such digital logic devices as a personal computer, a microprocessor, a microcomputer chip or the like.

Figure 2:
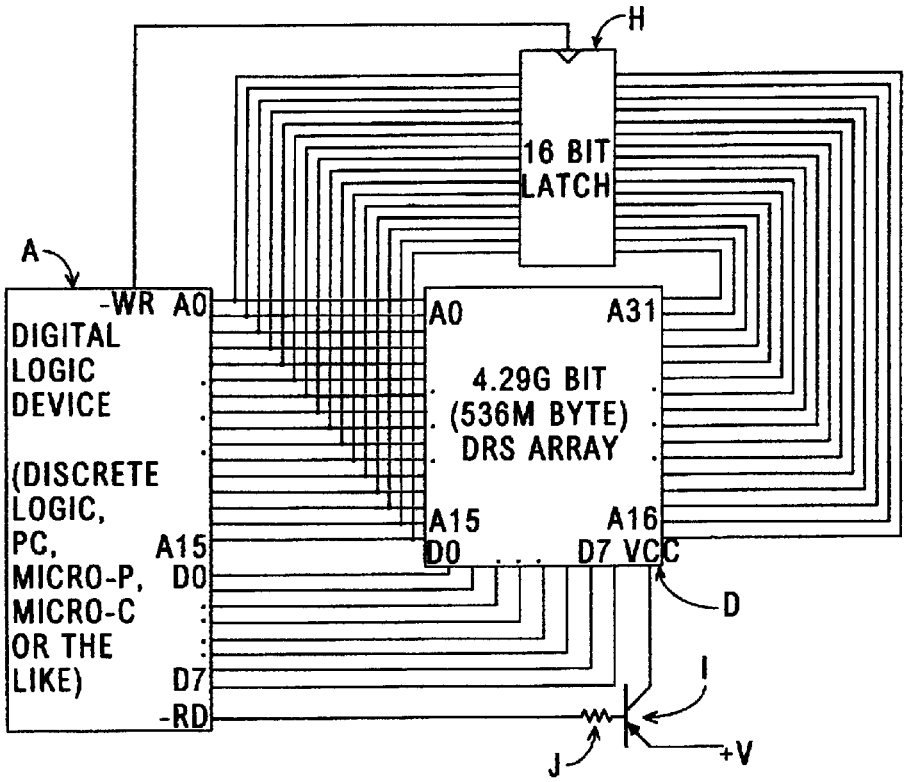
FIG. 2. illustrates a schematic diagram showing one way to interface a Dual-addressed Rectifier Storage Array to a digital logic device.

Refer now to FIG. 2 which shows a possible way to interface a Dual-addressed Rectifier Storage Array to a digital logic device. On microprocessor, A, the address lines (or input/output ports configured to perform the function of addressing), A0 through A15, connect directly to the lower address lines, A0 through A15, of the DRS Array, as well as to the inputs of the 16 bit latch, H. The upper 16 bits of the address to the DRS Array are set by writing to a location in memory having the same lower 16 address bits as is desired for the upper address bits. When the write line, −WR, goes low and, at the end of that write cycle (when that write line goes back high), that rising edge will cause the address bits A0 through A15 to be latched in the 16 bit latch, H, where they will be held to address the upper address lines of the DRS Array, A16 through A31, until the next write cycle. Note that the data byte written is ignored, only the address bits are needed to set the latch. (A variation would be to make use of that data byte to control the selection of multiple DRS Arrays or to address additional address bits of an even larger DRS Array. Other techniques for latching additional selection bits are readily known by those skilled in the art if multiple DRS Arrays are to be interfaced. Of course, if the digital logic device was a microprocessor having an addressing port sufficiently wider than the 16 bits shown in this figure, then the latching mechanism would be unnecessary as the entire DRS Array might be addressed directly.) The DRS Array is configured to be enabled by applying power through PNP transistor, I, and resistor, J, when the read line, −RD, goes low. The DRS Array as shown in FIG. 2 would contain about 537 Megabytes of information or about 56 minutes of 16-bit stereo audio sampled at 40,000 KHz, roughly the equivalent of a present day CD-ROM.

Throughout the remainder of this description, references will made to the positions of different parts of the DRS Array; this is for ease of looking at the figures only, and is not meant to imply physical location of components in an actual device. Also in this description, transistors in the fully on state will be referred to as being saturated. Switching transistors into and out of saturation is typically slower than switching them into and out of a nearly saturated state (although nearly saturated will generally work as well). Circuitry to keep transistors from becoming fully saturated is desirable but not required and has been omitted for the purpose of keeping the descriptions and figures uncluttered.

Figure 3:
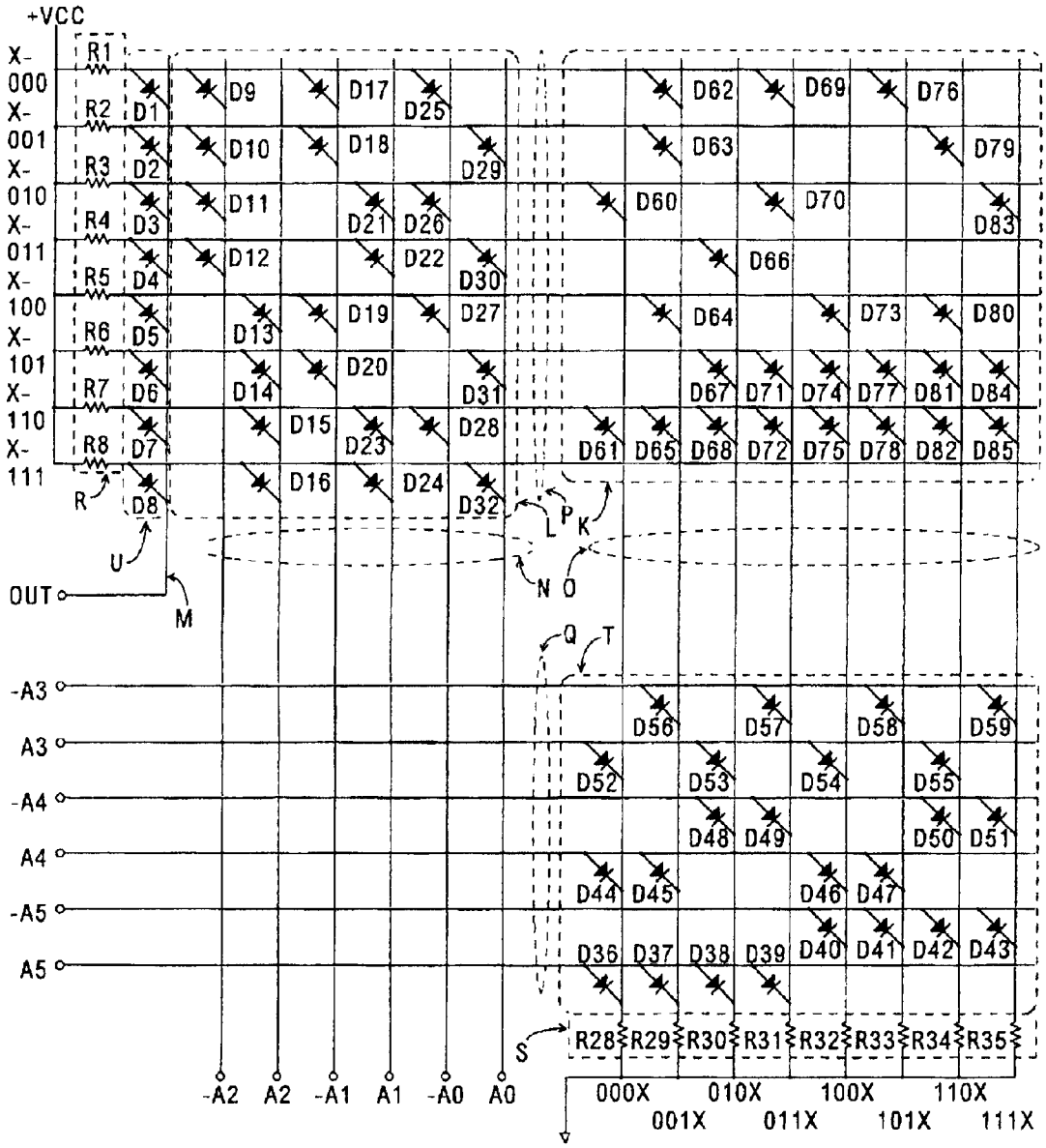
FIG. 3. illustrates a schematic diagram of a Dual-addressed Rectifier Storage Array.

Refer now to FIG. 3 which illustrates an example of a preferred embodiment of a Dual-addressed Rectifier Storage Array. While the array in this example is only 64 bits in size, it will become clear to one skilled in the art that this array is highly scaleable.

Rows are drawn running horizontally in this figure and [Columns] *columns* are drawn running vertically. The Storage Rows, P, are connected to the Row Resistors, R. Also connecting to the Storage Rows, P, at various points are the anodes of the Storage Rectifiers, K, the anodes of the Row Addressing Rectifiers, L, and the anodes of the Storage Bit Sensing Rectifiers, U. Connecting to the Addressing Columns, N, are the cathodes of the Row Addressing Rectifiers, L. Connecting to the Storage Bit Sensing Column, M, are the cathodes of the Storage Bit Sensing Rectifiers, U.

The Storage Columns, O, are connected to the Column Resistors, S. Also connecting to the Storage Columns at various points are the cathodes of the Storage Rectifiers, K, and the cathodes of the Column Addressing Rectifiers, T. Connecting to the Addressing Rows, Q, at various points are the anodes of the Column Addressing Rectifiers, T.

To understand the operation of the device, first consider what the operation of the device would be absent the row addressing means (the Row Addressing Rectifiers, L, and the Addressing columns, N) and the column addressing means (the Column addressing Rectifier, T, and the Addressing Rows, Q) and the bit sensing means (the Storage Bit Sensing Rectifiers, U, and the storage Bit Sensing Column, M). What would be left are the Storage Rows, P, which are each pulled to the positive supply through the Row Resistors, R, and the Storage Columns, O, which are each pulled to ground through the Column Resistors, S. The result would be that any rectifier present among the Storage Rectifiers, K, would be forward biased and the forward voltage drop of any said Storage rectifier would be centered around the voltage level of one-half of the positive supply (the Row Resistors, R, and the Column Resistors, S, are of equal resistance values and therefore form a voltage divider having a center voltage level of one-half of the positive supply). The resistive means, Row Resistors, R, and the Column Resistors, S, could be constructed through the use of resistors or their equivalent, the use of transistors (bipolar or FET) biased in their linear region (between being completely turned off and being saturated), the use of "leaky" diodes, or the like.

Next, consider the impact of the Row Addressing Rectifiers, L, and the Addressing Columns, N. The Addressing Columns, N, work in complementary pairs labeled by address designation An and its complement –An (where n indicates the Nth address line). Addressing is performed by pulling an Addressing Column near to ground or near to the positive supply and its complementary Addressing Column near to the positive supply or near to ground respectively. (Allowing an Addressing Column to float instead of pulling it close to the positive supply would work, too.) When an Addressing Column is pulled near to ground, any of the Row Addressing Rectifiers whose cathodes are connected to said Addressing Column will be forward biased and the voltage drop across those rectifiers will determine the resulting voltage on the Storage Rows connected to said forward biased Row Addressing Rectifiers. Storage Rows whose voltages are pulled down in this way are called "disabled." The voltage level on said disabled Storage Rows would be equal to the near to ground voltage on the Addressing Column plus the forward voltage across said forward biased Row Addressing Rectifier.

Next, consider the impact of adding the Column Addressing rectifiers, T, and the Addressing Rows, Q. The Addressing Rows, Q, work in complementary pairs labeled by address designation An and its complement –An (where n indicates the Nth address line) [addressing] *Addressing* is performed by pulling an Addressing Row near to ground or near to the positive supply and its complementary Addressing Row near to the positive supply or near to ground respectively. ([allowing] *Allowing* an Addressing Row to float instead of pulling it close to ground would work, too.) When an Addressing Row is pulled to the positive supply, any of the Column Addressing Rectifiers whose anodes are connected to said Addressing Row will be forward biased and the voltage drop across those rectifiers will determine the resulting voltage on the Storage Columns connected to said forward biased Column Addressing Rectifiers. Storage Columns whose voltages are pulled up in this way are called "disabled." The voltage level on said disabled Storage Column would be equal to [the] *or* near to the positive supply voltage on the Addressing Row minus the forward voltage across said forward biased Column Addressing Rectifier.

Disabling the Storage Rows by pulling their voltages down and disabling the Storage Columns by pulling their voltages up will reverse bias any Storage Rectifiers at the intersection of said disabled Storage Rows with said disabled Storage Columns. The Storage Rectifier, if any, at the intersection of the remaining enabled Storage Row with the remaining enabled Storage Column will be forward biased and the forward voltage drop of said Storage Rectifier, if any, would be centered around the voltage level of one-half of the positive supply. This would place the voltage level on the enabled Storage Row at one-half of the positive supply plus one-half of the forward voltage drop across said Storage Rectifier. Also, this would place the voltage level on the enabled Storage Column at one-half of the positive supply less one-half of the forward voltage drop across said Storage Rectifier. If no Storage Rectifier was present at the intersection of the remaining enabled Storage Row with the remaining enabled Storage Column then the voltage on that enabled Storage Row would be the positive supply and the voltage on that enabled Storage Column would be ground. (It should be noted that it does not matter if the storage rectifiers between the disabled rows and the disabled columns are forward biased because, as will be seen below, the storage bit sensing circuitry will not sense those Rows that have been shifted to the disabled voltage level.)

The Storage Bit Sensing Column, M, is to be biased to a voltage level just below the positive supply minus one rectifier forward voltage drop. Recalling that a disabled Storage Row will be at a voltage level equal to a near to ground voltage plus a rectifier's forward voltage, this means that the Storage Bit Sensing Rectifiers, U, between the Storage Bit Sensing Column, M, and each of the disabled Storage Rows will be reverse biased and conduct no current; this will account for the state of all of the Storage Bit Sensing Rectifiers, U, except the one connected between the Storage Bit Sensing Column, M, and the one enabled Storage Row. If a rectifier is present at the intersection of the enabled Storage Row with the enabled Storage Column [then that enabled Storage Row], then the voltage level on that enabled Storage Row would be at one-half of the positive supply plus one-half of a rectifier's forward voltage which would not be sufficient to forward bias the Storage Bit Sensing [RectiFier] *Rectifier* and no current will flow to the output, OUT. On the other hand, if no rectifier is present at the intersection of the enabled Storage Row with the enabled Storage Column then that enabled Storage Row, absent any Storage Bit Sensing Rectifier, would be at the Voltage potential of the positive supply; this is sufficient to forward bias the Storage Bit Sensing Rectifier and current will flow to the output, OUT. Naturally, this assumes that the voltage level of the positive supply is sufficiently high to forward bias the various rectifiers as described. Also, it is preferable to keep the positive supply to as low a voltage as possible in order to minimize power dissipation and to minimize the reverse voltages on the Storage Bit Sensing Rectifiers, U, thereby reducing the potential current leakage through those Storage Bit Sensing Rectifiers that might tend to offset the output current. This leakage current would be fairly constant and equal to the leakage of a rectifier reverse biased by an amount equal to the difference between the bias voltage on the output and the voltage on a disabled Storage Row multiplied by the number of disabled Storage Rows and, as such, could be corrected for if necessary. For example, an opposite current of equal magnitude could be injected into the Storage Bit Sensing Column.

As shown in FIG. 3, to the left of each Storage Row, P, is an address designation shown as an "X" followed by some binary digits. The "X" signifies the upper address bit inputs (which control the Addressing Rows, Q[.]) and the binary digits signify the lower address Bit inputs which control the Addressing Columns, N. As is shown, for each address bit input there are two Addressing Columns—one corresponding directly to the address bit input (labeled An) and one corresponding to the complement of that address bit input (labeled –An). Each bit position in the address designation of any Storage Row corresponds to a given address bit input and to a complementary pair of Addressing Columns. When the bit position contains a 0, a rectifier is connected between that Storage Row and the Addressing column corresponding to the complement of that address bit input. [when] *When* the bit position contains a 1, a rectifier is connected between that Storage Row and the Addressing Column corresponding directly to that address bit input.

Also as shown in FIG. 3, below each Storage Column, O, is an address designation shown as some binary digits followed by an "X". The "X" signifies the lower address bit inputs (which control the addressing Rows, N) and the binary digits signify the upper address bit inputs which control the Addressing Rows, Q. As is shown, for each address bit input there are two Addressing Rows—one corresponding directly to the address bit input (labeled An) and one corresponding to the complement of that address bit input (labeled –An). Each bit position in the address designation of any Storage Column corresponds to a given address bit input and to a complementary pair of Addressing Rows. When the bit position contains a 0, a rectifier is connected between that Storage Column and the Addressing Row corresponding directly to that address bit input. When the bit position contains a 1, a rectifier is connected between that Storage Column and the Addressing Row corresponding to the complement of that address bit input.

Figure 4:
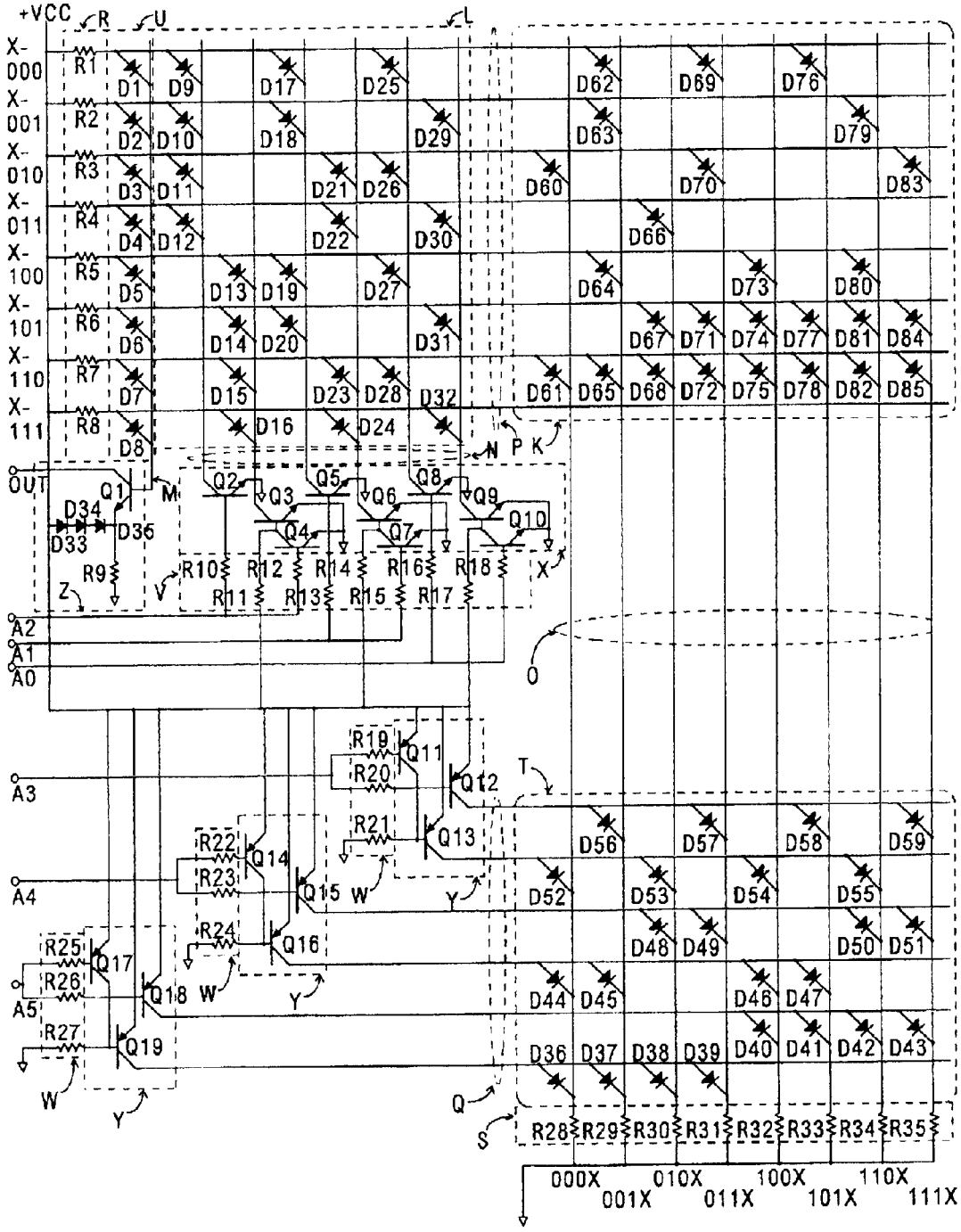
FIG. 4. illustrates a schematic diagram of a Dual-addressed Rectifier Storage Array which includes complementary address selection circuitry.

Refer now to FIG. 4 which shows identical circuitry to that shown in FIG. 3 except for the addition of complementary address input buffer-driver circuitry, V, W, X, and Y, as well as an output driver circuit, Z. Following the addressing of one complementary pair of addressing transistors controlled by address line A2, one will see that transistors Q2 and Q4 will be turned off through resistors R10 and R12 when A2 is at a low logic state (a low enough voltage that the base emitter junctions of Q2 and Q4 are not forward biased) or floating. When transistor Q4 is turned off, transistor Q3 will be turned on by the positive supply through resistor R11. One will also see that transistors Q2 and Q4 will be turned on through resistors R10 and R12 when A2 is at a high logic state. When Transistor Q4 is turned on, it will pull away the current available at the base of Q3, dropping the voltage on the base of Q3 and thereby turning off Q3. The result is that the directly addressed Addressing column, A2, will be pulled to near ground (approximately 0.2 v) when A2 is low and Q3 is turned on (saturated), or the complementary addressed Addressing Column, –A2, will be pulled to near ground (approximately 0.2 v) when A2 is high and Q2 is turned on.

Following the addressing of another complementary pair of addressing transistors controlled by address line A3, one will see that transistors Q11 and Q12 will be turned off through resistors R19 and R20 when A3 is at a high logic state (a high enough voltage that the base emitter junctions of Q11 and Q12 are not forward biased) or floating. When transistor Q11 is turned off, transistor Q13 will be turned on through resistor R21 to ground. One will also see that transistors Q11 and Q12 will be turned on through resistors R19 and R20 when A3 is at a low logic state. When transistor Q11 is turned on, it will cause the voltage on the base of Q13 to come within 0.2 v of the positive supply and thereby turning off Q13. The result is that the complementary addressed Addressing Row, –A3, will be pulled to within 0.2 v of the positive supply when A3 is low and Q12 is turned on, or the directly addressed Addressing Row, A3, will be pulled to within 0.2 v of the positive supply when A3 is high and Q13 is turned on.

The output driver circuit, Z, achieves the voltage biasing of the Storage Bit Sensing Column, M, while providing gain to the output current. The three rectifiers, D33, D34, and D35, serve to set the voltage on the emitter of transistor Q1 at three rectifier forward voltage drops below the positive supply. Assuming that the forward voltage drop across the base-emitter junction of transistor Q1 is the same as the forward voltage drop of the rectifiers, this would require that the base of that transistor be at a voltage level no less than two rectifier forward voltage drops below the positive supply in order for its collector to draw current, which in turn would require that the one enabled Storage Row be at a voltage level no less than one rectifier forward voltage drop below the positive supply in order for the collector of transistor Q1 to draw current. Naturally, it is not necessary that the forward voltage drop across the base-emitter junction of transistor Q1 would be the same as the forward voltage drop of the rectifiers and one skilled in the art will know of other ways to bias the Storage Bit Sensing Column.

The circuit used to describe the operation of a DRS Array and shown in FIG. 4 can be constructed using silicon diodes (such as the 1N914) for all of the rectifiers; 1 MΩ resistors for all of the Row Resistors, R, and Column Resistors, S, and for the resistor in the output driver circuit, R9; 10KΩ resistors for all of the resistors of the address input buffer-driver circuitry, V and W; 2N3904 transistors for all of the NPN transistors and 2N3906 transistors for all of the PNP transistors. The output will sink virtually no current when addressing the point of intersection of a Storage Row with a Storage Column that has a rectifier present at that point. If no rectifier is present at the addressed point of intersection, approximately 0.7 μA will flow into the base of Q1 and, assuming a current gain (β) of about 100 times for Q1, the output will therefore sink [abouto] *about* 0.07 mA.

Figure 5:
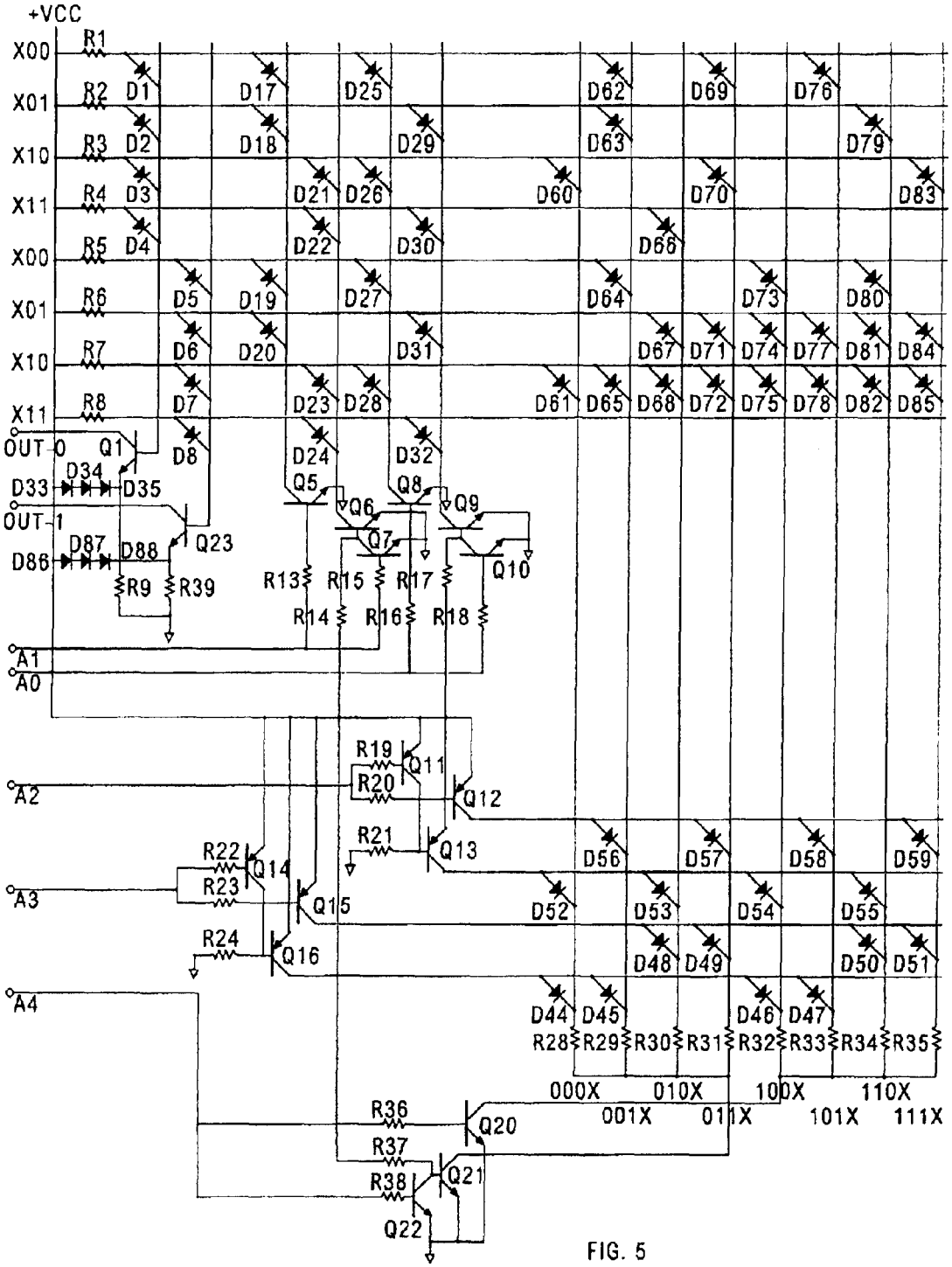
FIG. 5. illustrates a variation on the data sensing means of a Dual-addressed Rectifier Storage Array for simultaneously accessing multiple stored bits in parallel and a variation on the addressing means for reducing the device's power consumption.

Some variation on this idea will be apparent. FIG. 5 shows two variations on the Dual-addressed Rectifier Storage Array. The first variation relates to the number of bits of stored information that will be retrieved at the same time. Notice that Row Addressing Rectifiers D9 through D16, transistors [QZ] *Q2* through Q4 and resistors R10 through R12 have been removed, that transistor Q23, rectifiers D86, D87, and D88 and resistor R39 have been added, and that the Storage Bit Sensing Rectifiers have been split into two groups where the cathodes of rectifiers D5 through D8 are now connected to the base of transistor Q23 through a new Storage Bit Sensing Column. The resulting circuit is the equivalent of two DRS Arrays placed one above the other with each having four Storage Rows and eight Storage Columns where those eight Storage Columns (and their associated addressing means) are common to both arrays and where the Addressing Columns that are connected to the cathodes of the Row Addressing Rectifiers of the two arrays (and their associated addressing means) are also common to both. Transistor Q1, rectifiers D33, D34, and D35, and resistor R9 now operate with Storage Bit Sensing Rectifiers, D1, D2, D3, and D4, to detect state of the addressed bit within one array and transistor Q23, rectifiers D86, D87, and D88, and resistor R39 now operate with Storage Bit Sensing Rectifiers, D5, D6, D7, and D8, to detect state of the addressed bit within the other array. In this way, two bits—one from one array and one from the other array—will be read out at the same time. One skilled in the art will recognize that this variation can be applied multiple times such that even larger numbers of bits can be read simultaneously.

Also shown in FIG. 5 is a variation relating to the power requirements of the device and, in particular, to limiting the current in the device to only a portion of that device thereby reducing the overall power consumption. Notice that Column Addressing Rectifiers D36 through D43, transistors Q17 through Q19 and resistors R25 through R27 have been removed, that transistors Q20, Q21 and Q22, and resistors R36, R37, and R38 have been added and that the Storage Columns have been divided into two groups where one group is connected to the collector of transistor Q20 through column Resistors R28 through R31 and the other group is connected to the collector of transistor Q21 through Column Resistors R32 through R35. Address line A4 controls transistors Q20, Q21, and Q22 such that Q20 and Q21 are a complementary pair that controls the enabling of the left four lines or the right four lines of the Storage columns. Since a Storage Column is otherwise disabled by applying a voltage to that line (through an Addressing Row and a Column addressing Rectifier) which results in a current equal to roughly the difference of the positive supply less 0.9 v divided by the Cathode Resistor value 1 MΩ (4.1 μA if using a 5 v supply), wherever a line can be disabled by cutting off the current through the Column Resistor, that much [currert] *current* will be saved. These savings will become significant in much larger arrays having a very large number of Storage Columns. The limit on the number of address lines that will control this type of power reducing means for enabling Storage Columns relates to the complexity of the circuit by increasing the number of transistors (a complex component) while reducing the number of rectifiers (a relatively less complex component). One skilled in the art will recognize that this same type of power saving enabling means could also be created on the Storage Rows by using PNP transistors to control the cutting off of current to those Storage Rows (through the Row Resistors).

Another variation might be to use differently made components. For example, in the above explanation, silicon rectifiers having a forward voltage of about 0.7 v and transistors having base-emitter forward voltages also of about 0.7 v were assumed. But, other types of rectifiers and transistors could be used having lower or higher forward voltages. In another variation, the Storage Rectifiers used could be the base-emitter junctions of NPN transistors (having all of their collectors tied together in the same way one would tie together the outputs of opened-collector gates in a logical AND configuration); this would make it possible to eliminate all of the Storage Bit Sensing Rectifiers, transistor Q1, resistor R9 and rectifiers D33, D34 and D35 and instead sense the current sunk on the combined collectors. Since no more than one Storage Rectifier will be conducting at any time, current being sunk on the combined collectors would indicate that a Storage Rectifier (a base-emitter junction) exists at the point of intersection of the enabled Storage Row and the enabled Storage Column. Other variations could include[,] memory cells comprising a fusible link resulting in a One Time Programmable Read Only Memory (OTPROM) device (see U.S. Pat. Nos. 4,312,046 and 4,385,368), or memory cells comprising charge-storage devices to create a Random Access Memory (RAM) device (see U.S. Pat. Nos. 3,626,389 and 3,838,405).

Figure 12:
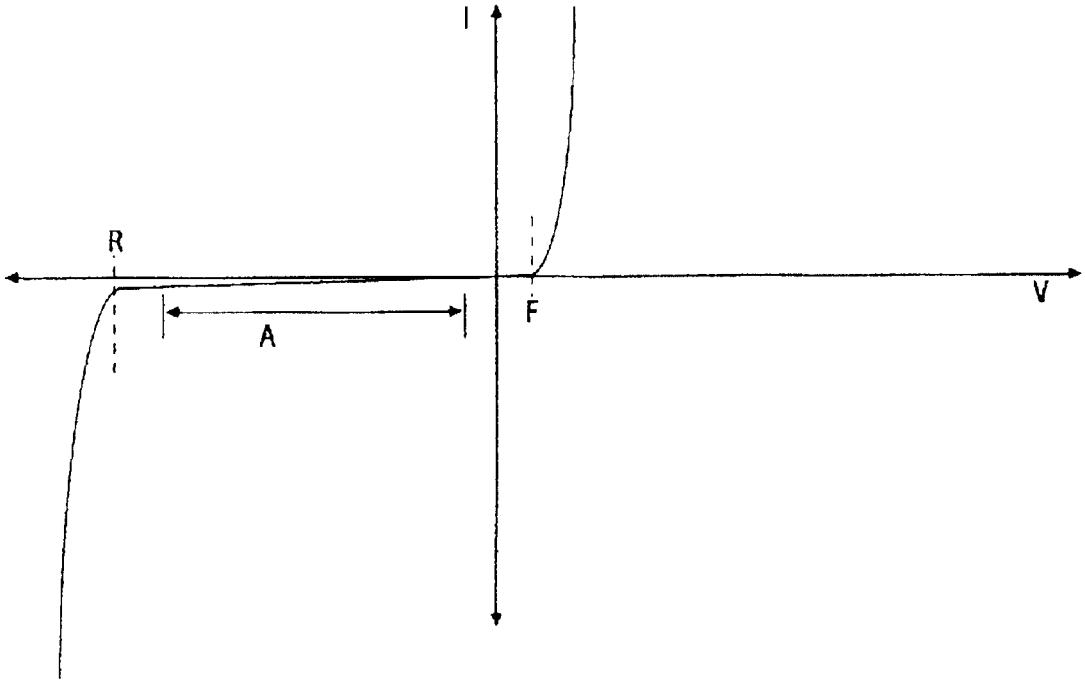
FIG. 12. illustrates a plot of the voltage/current relationship of a diode.

The above description of the preferred embodiment makes reference to a variation on the resistive means—that of using "leaky" diodes. FIG. 12 shows a plot depicting the voltage/current relationship of a typical diode, where the horizontal axis is voltage, V, and the vertical axis is current, I. Moving right from the plot's origin, one can see that no significant current flows through the diode until the Forward Voltage, F, is reached. Moving left from the plot's origin, one can see that only a small amount of leakage current flows until the Reverse Breakdown Voltage, R, is reached. However, there is a region, A, between the origin and the point of the Reverse Breakdown Voltage where the device behaves similarly to a resistor.

Figure 13:
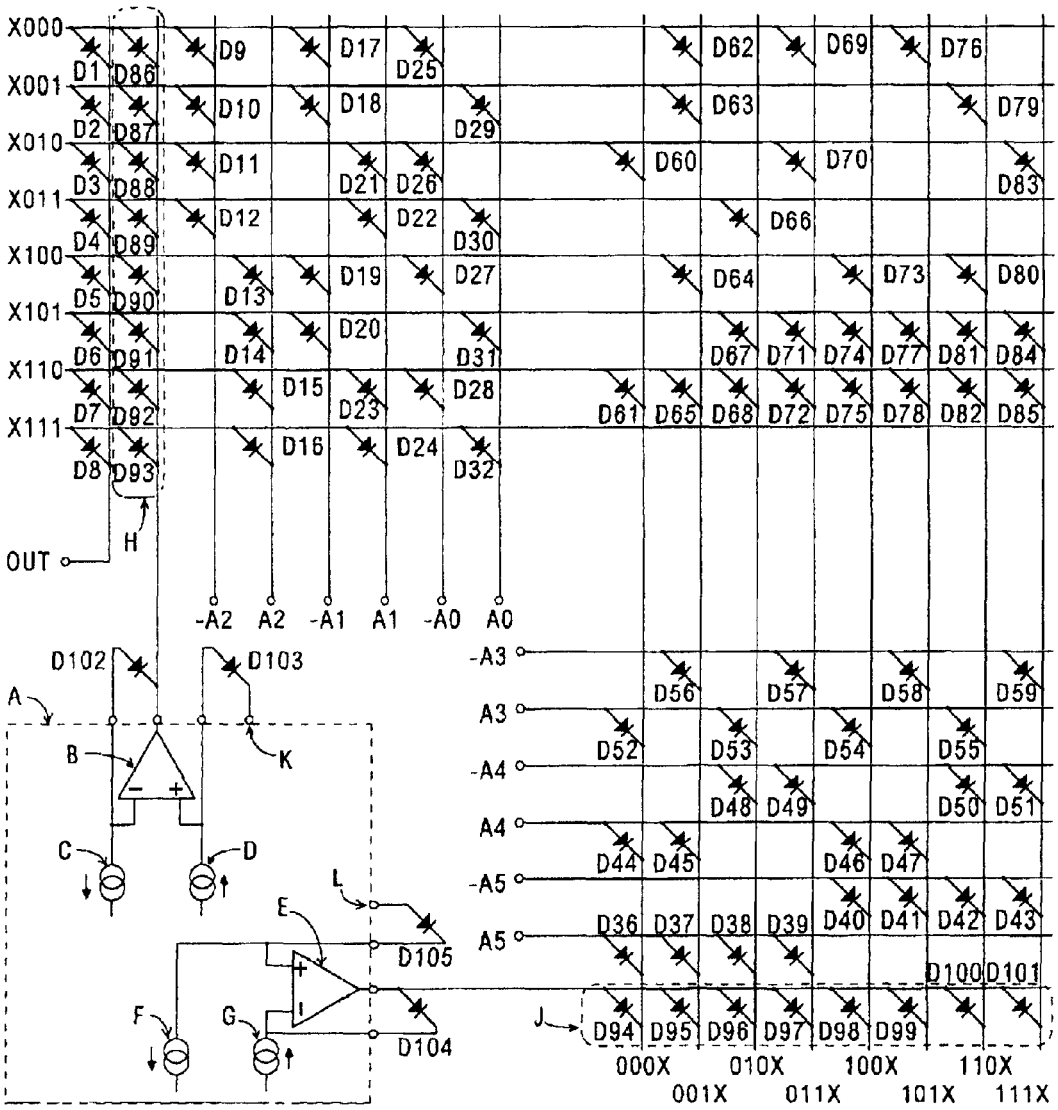
FIG. 13. illustrates a schematic diagram of a variation on the Dual-addressed Rectifier Storage Array wherein the resistive means is accomplished via "leaky" diodes.

FIG. 13 shows a variation wherein the resistive means comprises diodes that are believed to operate in this resistor-like region. The diode biasing circuit, A (which would typically not be constructed as a part of an integrated circuit comprising the remainder of the circuit shown in this figure), comprises circuitry for biasing a row of diodes, H, in this resistor-like region for the row lines as well as circuitry for biasing a row of diodes, J, in this resistor-like region for the column lines. All of the diodes would be formed as a part of the same integrated circuit and would therefore have operating characteristics that are matched. On the row lines, the diodes, H, will be biased between the voltage of a disabled row and the voltage present at the output of the operational amplifier, B. The operational amplifier circuitry will ensure that the voltage across feedback diode D102 will be the same as is across the diodes, H. As a result, the current through diodes, H, and diode D102 will be the same as a result of the device matching. This is accomplished by pulling down point K in identical fashion to when pulling down any of the row address lines (A0 through −A2). This ensures that the voltage on the anode of diode D103 will match the voltage on any one of the disabled row lines since an operational amplifier operates (as one skilled in the art knows) such that the same voltage will be present at the '+' and '−' terminals in normal feedback mode. Current sources C and D have equal magnitude and ensure that the same current flows through D102 and D103 and, therefore, that the voltage drop across D102 and D103 is matched; they could be constructed as a part of a standard current mirror circuit. The result is that the voltage at the anode of diode D102 matches the voltage on one of the disabled row lines, that the voltage on the anodes of diodes D86 through D93 matches the voltage at the anode of diode D102 (they are connected to the row lines), and the cathodes of all the diodes D86 through D93 as well as the cathode of diode D102 are at the same voltage (which is greater than that of the disabled row lines resulting in a reverse voltage across all the diodes). Given that the reverse voltage drop across diodes D86 through D93 is the same as that across diode D102, the current leaking through the diodes D36 through D93 will be the same as the current leaking through diode D102 (and controlled by current source C) due to their matched operating characteristics. The same mechanism is essentially accomplished for the column line resistive means with via operational amplifier E, current sources F and G, diodes D94 through D101, feedback diode D104 and diode D105, but with opposite polarity. Note that point L would be sourced in identical fashion to the sourcing of the column address lines (–A3 through A5).

FIG. 13 also shows a possible solution should the cumulative diode leakage currents in extremely large arrays of Storage Rectifiers become noticeable. An additional Addressing Row, N, has been included. Notice this row has a rectifier connecting it to every one of the Storage Columns and that asserting this row by pulling it to the positive supply will disable the one remaining Storage Column that had been left enabled. As a result, it is believed that one could detect the presence of a Storage Rectifier at the point of intersection of the enabled Storage Row and Storage Column even with the existence of such leakage currents by sampling the level at the output both while asserting and not asserting this Addressing Row, N. Since the presence of a Storage Rectifier will result in a loading of the one enabled Storage Row by connecting that row through the Storage Rectifier to the remaining enabled Storage Column, disabling that Storage Column would remove this loading and result in a slightly higher voltage at the Output. However, if no Storage Rectifier is present, the level at the Output should not show any significant change.

Other variations might include reversing the polarity and types of some of the components. Because of the symmetry of the DRS array, many of the techniques shown in one area of the device can be implemented in the opposite area with only a reversal of polarities. [for] *For* example, one skilled in the art will recognize that [The] *the* Storage Bit Sensing Rectifiers could be connected to the Storage Columns if transistor Q1 was of the PNP type, rectifiers D33, D34, and D35 were reversed in polarity and connected in series to ground instead of to the positive supply, and resistor R9 was connected to the positive supply instead of to ground; in this variation, the collector of transistor Q1 would be a current source instead of a current sink.

Figure 6:
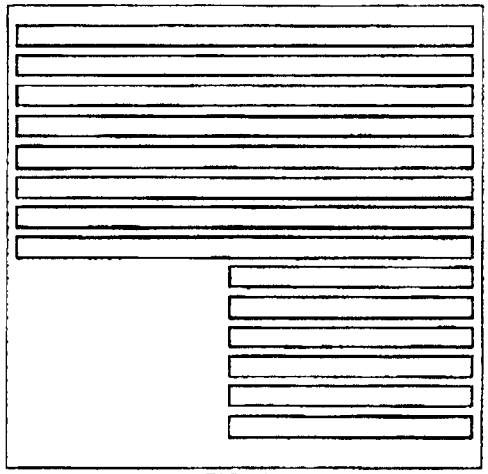
FIG. 6. illustrates the doping step in the semiconductor manufacture of the Anode Lines, Cathode Lines, and rectifiers comprised by a Dual-addressed Rectifier Storage Array.
Figure 9:
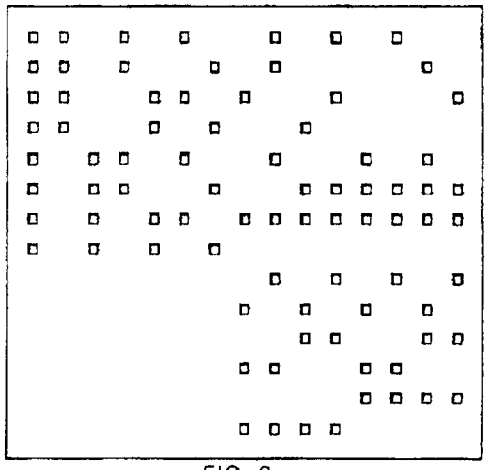
FIG. 9. illustrates the metalization step in the semiconductor [Manufacture] *manufacture* of the Anode Lines, Cathode Lines, and rectifiers comprised by a Dual-addressed Rectifier Storage Array.
Figure 7:
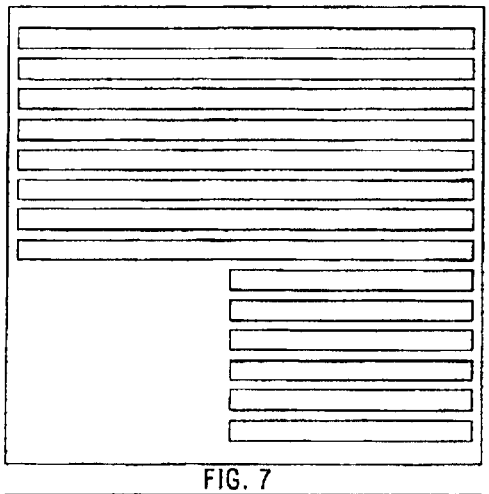
FIG. 7. illustrates the oxide growth step in the semiconductor manufacture of the Anode Lines, Cathode Lines, and rectifiers comprised by a Dual-addressed Rectifier Storage Array.
Figure 10:
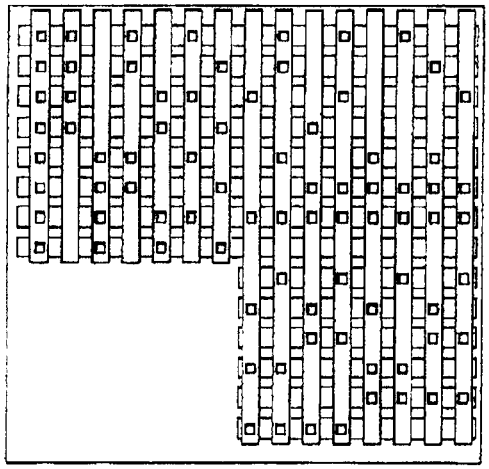
FIG. 10. illustrates the metalization etching step in the semiconductor manufacture of the Anode Lines, Cathode Lines, and rectifiers comprised by a Dual-addressed Rectifier Storage Array.
Figure 8:
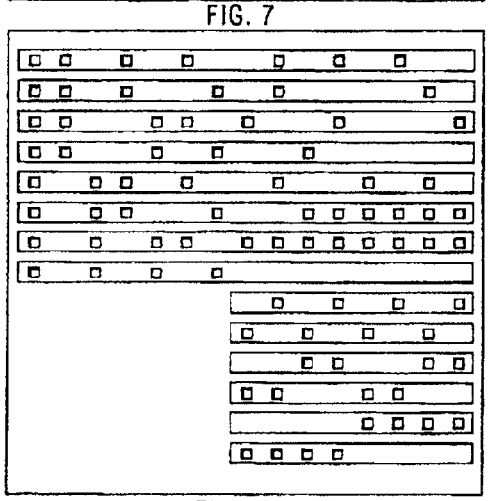
FIG. 8. illustrates the oxide etch step in the semiconductor [Manufacture] *manufacture* of the Anode Lines, Cathode Lines, and rectifiers comprised by a Dual-addressed Rectifier Storage Array.

In another variation the means of row or column selection by disabling certain rows or columns might be used in combination with other selection means disclosed in the prior or subsequent art. It is believed that Dual-addressed Rectifier Storage Arrays will typically be fabricated as an integrated circuit; a possible layout of the Rows, the Columns, and the rectifiers are shown in FIGS. 6 through 10 (the addressing transistors and resistors, the Row and Column Resistors, and the connection pads to the chip have been omitted for clarity—the fabrication of these devices are well known to those skilled in the art). In FIG. 6, an N-type wafer is shown to be doped with P-type channels which form the Rows. Next (FIG. 7) is shown that an oxide layer is grown and then (FIG. 8) openings corresponding to the rectifiers in the circuit are etched through that oxide layer. The data stored in the device is programmed during this step—wherever a Storage Rectifier is desired, a hole is etched through the oxide layer (it should be noted that the pattern of the openings matches the pattern of the rectifiers as drawn in FIG. 3). FIG. 9 shows the chip with an aluminum metalization layer and finally (FIG. 10) shows the result of etching that aluminum into vertical lines which form the Columns. Wherever the aluminum contacts a doped region through one of the holes in the oxide layer, a rectifier (of the type sometimes referred to as a metal-on-silicon junction type or as a Schottky Diode type) is formed. The N-type wafer substrate would be kept at the most negative voltage in the circuit thereby creating reverse biased p-n junction between the doped regions and the substrate, the result of which is to electrically isolate those generally parallel doped regions. The generally parallel metalized regions which form the Columns are electrically isolated from each other due to their being formed upon the non-conducting oxide layer (except where they contact the doped regions through the holes in the oxide layer). Where the aluminum Columns contact the P-type Rows, a metal-on-silicon junction rectifier is formed such that the current flow (where conventional current flow is the flow of holes, that is to say, current flowing from positive voltage potential to negative voltage potential) is from the doped regions to the metalized regions when the junction is forward biased. As shown in FIG. 10, space is available for the manufacture of the addressing components and the Row and Column Resistive means at the lower left corner of the chip and around the edges.

The addressing components might also be modified when constructing a DRS Array as an integrated circuit. The pair of resistors directly connected between each address input and the bases of the two addressing transistors could be replaced by a single resistor (as shown in FIG. 3, a single resistor could do the job of resistors R10 and R12, a single resistor could do the job of resistors R13 and R15, and so on). Those transistors could be external to the integrated circuit form of the DRS Array.

A variation on the semiconductor manufacturing of a DRS Array might be to dope N-type regions into a P-type wafer thereby reversing the polarity of the metal-on-silicon junction rectifiers (the Rows and the Columns would be reversed). Another variation would spread out the Addressing Columns across the width of the chip—alternating Addressing Columns with one or more Storage Columns—instead of grouping those Addressing Columns at the left side of the chip; this will spread out those [Lines] *lines* carrying most of the current in the circuit thereby more evenly distributing the power dissipation across the chip (the same technique could be done with the Rows). Another variation would be to construct the device with p-n junction rectifiers or a combination on metal-on-silicon junction rectifiers and p-n junction rectifiers.

Figure 11:
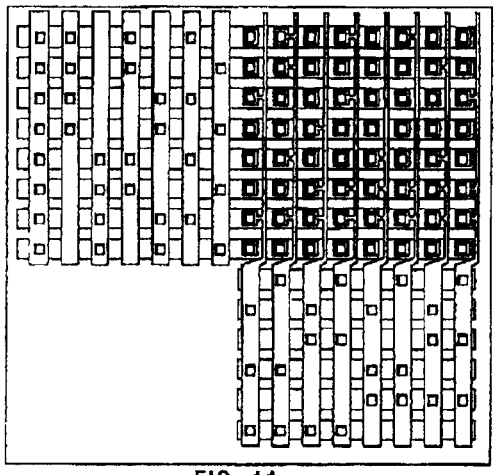
FIG. 11. illustrates a variation on the semiconductor manufacture of the Anode Lines, Cathode Lines, and rectifiers comprised by a Dual-addressed Rectifier Storage Array.

Another variation might enable programming the stored data during the metalization etching step. Referring to FIG. 11, an opening has been etched through the oxide layer at every potential Storage Rectifier location. Programming of the stored data bits is accomplished when the metalization layer is etched. In those locations where a storage Rectifier is desired, a metal connection is left during the metal etching step between the metal pad covering the opening in the oxide layer and the metal Column; where no storage Rectifier is desired, that metal connection is etched away. It is believed that this approach will enable all of the semiconductor manufacturing steps, except the final metal etching step to be performed and that wafers so made could be stored safely under the protective metalized layer. In this way, wafers could be mass produced without regard to the data to be stored in the chip.

Economic concerns may drive several other possible variations on the semiconductor manufacturing of a DRS Array. It is expected that a significant part of the cost to manufacture these devices will be in the packaging where the greater the number of electrical connections between the package and the controlling device, the greater the cost of that packaging; a package with more leads will be more expensive and more prone to mechanical failures. As a result, it is believed that steps will be taken to reduce the number of package leads needed. One skilled in the art will quickly realize the circuitry needed to implement any of the following variations. One possibility would be to address the lower address lines directly but to retain the higher address lines internally; in other words, the latch shown in FIG. 2 would be incorporated into the DRS Array integrated circuit.

Figure 14:
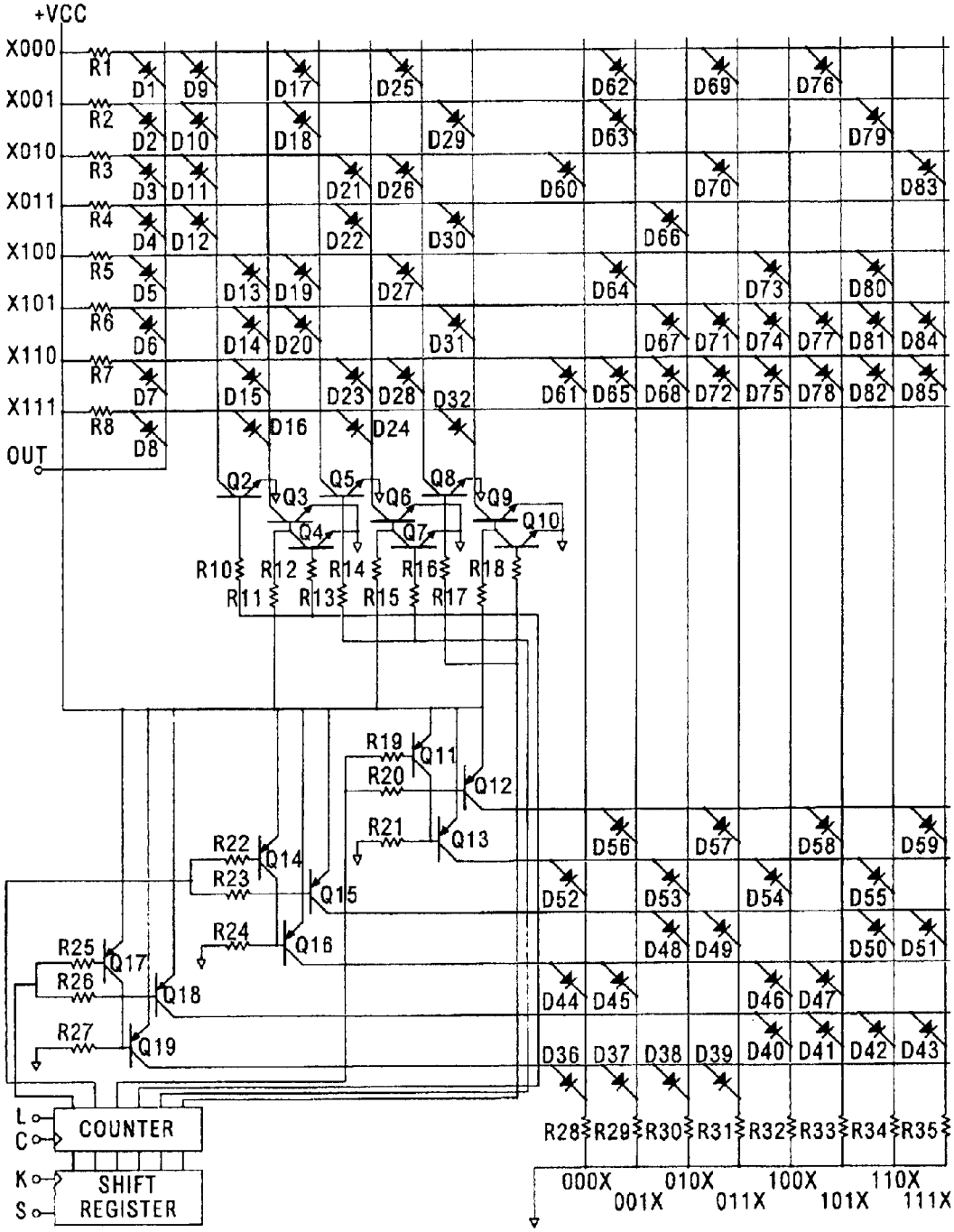
FIG. 14. illustrates a schematic diagram of a variation on the Dual-addressed Rectifier Storage Array which includes serial addressing circuitry.

Another possibility would be to incorporate a shift-register where the address bits would be shifted into the device serially and retained thereby reducing the number of addressing leads to two (the shift-register serial input and the shifting-clock). However, a more practical variation, shown in FIG. 14, might be to incorporate both a counter and a shift register where the shift register would be used to enter an address onto the chip which could then be loaded into the counter. In this last variation of the serially loaded counter, the address would be retained within the counter so the many address lines are essentially reduced to four: one for the serial address input (S), one for clocking the shift register (K), one for clocking the counter (C), and one for loading the address into the counter from the shift register (L). One skilled in the art will quickly realize the circuitry needed to implement any of these variations. One well skilled in the art will recognize that a reduction to three lines can be achieved here resulting in a total of six connections to the chip (three plus power, ground, and data out).

Finally, a variation on the digital logic device comprising one or more DRS Arrays of which one or more may be removable which themselves comprise the above mentioned serially loaded counter logic. By limiting the manufacture of such devices to having output in analog format only, the risks to the makers of programming (e.g., music and video programs) will be reduced. With CD-ROM technology, the output from some CD-ROM readers is in a digital format. As a result, any copy made will be of the same quality as the original. This potentially results in significant lost revenue as the users of this technology could casually make copies for friends and relatives that cannot be distinguished from the originals (this was not the case with prior technologies such as cassette tapes and video tapes where each successive copy degraded somewhat). By limiting the manufacture of devices comprising DRS Arrays that are addressed via serially loaded counters to analog output only, the same degradation of copies will occur thereby reducing some of the risks to the makers of programming by causing the copies to be less desirable than the originals. While devices comprising DRS Arrays that are addressed via serially loaded counters could be limited to analog output only, they could still include means for reading DRS Arrays in other formats (i.e., DRS Arrays directly addressed via many address lines), however, devices comprising DRS Arrays that are directly addressed via many address lines and which give digital access to the information stored therein would not include means for reading DRS Arrays that are addressed via serially loaded counters.

It is believed that minor flaws in the semiconductor wafer will mostly impact the operation of the metal-on-silicon junction rectifiers when they are reverse biased by lowering the reverse breakdown voltage. Since the DRS Arrays are expected to be operated at low voltage levels, large reverse voltages are considered unlikely in normal operation. As a result, the impact of these minor flaws are not expected to impact the operation of the device and high device manufacturing yields are anticipated. However, the addressing transistors will likely be adversely affected by such flaws. There will likely be a trade-off between the increased cost of manufacture resulting from lowered device yields (as a result of the impact of semiconductor flaws on the increased complexity of the addressing circuit) and the savings on packaging (as a result of reducing the number of device leads).

The selection of a line by disabling all undesired lines could be utilized in many related electronic devices. The rectifiers at the storage locations could be fabricated as Light Emitting Diodes (LED's) with such a rectifier present at every storage location. In this way, the device could be used as a display panel where a given display pixel could be turned on by selecting that bit location; the display panel would be scanned, selecting and illuminating bit locations in sequence while skipping bit locations that are to remain dark. Also, using a technique such as pulse width modulation, which is well known to one skilled in the art, one could even control the duration of a pulse of light emitted at any given pixel location and thereby control the perception of the intensity of the light emitted.

The high expected storage densities come from the symmetry *of* the design—the Storage Bit Sensing Rectifiers, [The] *the* Addressing Rectifiers, and the Storage Rectifiers are all constructed in the same way. The result of this is that they can all be made at the same time with the same semiconductor manufacturing steps. By using metal-on-silicon junction rectifiers, the primary components in the circuit are essentially constructed vertically on the semiconductor's surface instead of horizontally as might conventionally be done resulting in a very efficient use of the semiconductor "real estate". The scaling up of the device is expected to be easily accomplished. For example, on a one inch square chip, if the Anode Lines and the Cathode Lines are placed at roughly 0.45 micron center to center spacing, then a DRS Array that is roughly 65,536 by 65,536 Lines could be made. This is the equivalent of about 4,294,967,296 bits or about 536,870,912 bytes or about the capacity of a present day CD ROM. State of the art technology at the time of this writing is below 1 micron line widths. It is envisioned that the present invention could be used anywhere that one would use a CD-ROM drive or player or anywhere a large amount of information is needed.

The foregoing description of an example of the preferred embodiment of the invention and the variations thereon have been presented for the purposes of illustration and description. It is not intended to be exhaustive or to limit the invention to the precise forms disclosed. Many modifications and variations are possible in light of the above teaching. It is intended that the scope of the invention be limited not by this detailed description, but rather by the claims appended hereto.

I claim:

[1. A digital logic device comprising one or more electronic information storage means, and addressing means for accessing said storage means, wherein each said electronic information storage means comprises:

a plurality of generally parallel conductive means;

a second plurality of generally parallel conductive means that is generally perpendicular to and overlapping with the first said plurality of generally parallel conductive means;

a plurality of bits of potential information storage where a bit of said plurality of bits is present in the general vicinity of each point of intersection of each conductive means of the first said plurality of generally parallel conductive means with each conductive means of the second said plurality of generally parallel conductive means, and where the state of any said bit is determined by the presence or absence of a rectifying conductive means at each said general vicinity of said point of intersection;

means for selecting a conductive means of one plurality of generally parallel conductive means, and means for biasing the generally parallel conductive means of the other plurality of generally parallel conductive means such that each said rectifying conductive means present between a conductive means of said biased plurality of generally parallel conductive means to a conductive means of the other said plurality of generally parallel conductive means is potentially forward biased;

means for selecting a biased conductive means by electronically disabling conductive means within said biased plurality of generally parallel conductive means by shifting the voltage of those biased conductive means that are to be disabled; and wherein said addressing means comprises:

means for controlling said means for electronically selecting conductive means of one said plurality of generally parallel conductive means and for electronically selecting conductive means of the other said plurality of generally parallel conductive means.]

[2. The digital logic device of claim 1, wherein said means for selecting a conductive means of one plurality of generally parallel conductive means comprises:

means for biasing the generally parallel conductive means of the said one plurality of generally parallel conductive means such that each said rectifying conductive means present between a conductive means of said biased plurality of generally parallel conductive means and a conductive means of the other said plurality of generally parallel conductive means is potentially forward biased; and means for selecting a biased conductive means by electronically disabling conductive means within said biased plurality of generally parallel conductive means by shifting the voltage of those biased conductive means that are to be disabled.]

[3. The digital logic device of claim 1, further comprising means for detecting a conducted current through said rectifying conductive means if present at said point of intersection.]

4. The [digital logic device] *circuit* of claim [1] *31*, wherein one of [said plurality of generally parallel conductive means] *the sets of conductive lines* is a plurality of generally parallel doped regions within a semiconductor material.

5. The [digital logic device] *circuit* of claim [4] *31*, wherein [the other of said plurality of generally parallel conductive means] *one of the sets of conductive lines* is a plurality of generally parallel metalized regions.

6. The [digital logic device] *circuit* of claim [1] *31*, wherein said addressing [means] *circuitry* comprises [means] *circuitry* to sequentially select [addressed] *storage* locations.

7. The [digital logic device] *circuit* of claim [1] *31*, wherein said addressing [means] *circuitry* comprises [means] *circuitry* to randomly select [addressed] *storage* locations.

8. The [digital logic device] *circuit* of claim [1] *31*, further comprising display means for displaying alphanumeric or graphic information to [its] *a* user.

9. The [digital logic device] *circuit* of claim [1] *31*, further comprising input means to enable its user to alter its operation.

10. The [digital logic device] *circuit* of claim [1] *31*, wherein part or all of said [one more electronic storage means are] *circuit is* removable or replaceable.

11. The [digital logic device] *circuit* of claim [1] *31*, wherein output from the [device] *circuit* is in a digital format.

12. The [digital logic device] *circuit* of claim [1] *31*, wherein output from the [device] *circuit* is in an analog format.

13. The [digital logic device] *circuit* of claim [1] *31*, wherein output from the [device] *circuit* is in either a digital format or an analog format.

[14. An electronic information storage device comprising:

a plurality of generally parallel conductive means;

a second plurality of generally parallel conductive means that is generally perpendicular to and overlapping with the first said plurality of generally parallel conductive means;

a plurality of bits of potential information storage where a bit of said plurality of bits is present in the general vicinity of each point of intersection of each conductive means of the first said plurality of generally parallel conductive means and each conductive means of the second said plurality of generally parallel conductive means, and where the state of any said bit is determined by the presence or absence of a rectifying conductive means at each said general vicinity of said point of intersection;

means for selecting a conductive means of one plurality of generally parallel conductive means, and means for biasing the generally parallel conductive means of the other plurality of generally parallel conductive means such that each said rectifying conductive means present between a conductive means of said biased plurality of generally parallel conductive means and a conductive means of the other said plurality of generally parallel conductive means is potentially forward biased; and means for selecting a biased conductive means by electronically disabling conductive means within said biased plurality of generally parallel conductive means by shifting the voltage of those biased conductive means that are to be disabled.]

[15. The storage device of claim 14, wherein said means for selecting a conductive means of one plurality of generally parallel conductive means comprises:

means for biasing the generally parallel conductive means of the said one plurality of generally parallel conductive means such that each said rectifying conductive means present between a conductive means of said biased plurality of generally parallel conductive means and a conductive means of the other said plurality of generally parallel conductive means is potentially forward biased; and means for selecting a biased conductive means by electronically disabling conductive means within said biased plurality of generally parallel conductive means by shifting the voltage of those biased conductive means that are to be disabled.]

[16. The storage device of claim 14, further comprising means for detecting a conducted current through said rectifying conductive means if present at said point of intersection.]

[17. The storage device of claim 14, wherein one of said plurality of generally parallel conductive means is a plurality of generally parallel doped regions within a semiconductor material.]

18. The [storage device] *circuit* of claim [17] *5*, wherein said [rectifying conductive means between said plurality of generally parallel doped regions and a plurality of generally parallel metalized regions is] *nonlinear elements are* of the metal-on-semiconductor junction type.

19. The [storage device] *circuit* of claim [17] *5*, wherein said [rectifying conductive means between said plurality of generally parallel doped regions and a plurality of generally parallel metalized regions is] *nonlinear elements are* of the p-n junction type.

[20. The storage device of claim 14, wherein one of said plurality of generally parallel conductive means is a plurality of generally parallel metalized regions.]

21. The [storage device] *circuit* of claim [14] *31*, wherein said [rectifying conductive means is comprised by a transistor as the base-emitter junction] *nonlinear elements comprise base-emitter junctions of transistors*.

22. The [storage device] *circuit* of claim [14] *31*, further comprising means for retaining the address of the information to be accessed.

23. The [storage device] *circuit* of claim 22, further comprising means for incrementing the retained address.

24. The [storage device] *circuit* of claim 22, further comprising means for setting the retained address.

[25. An electronic information storage device comprising a plurality of storage means where each storage means comprises:

a plurality of generally parallel conductive means;

a second plurality of generally parallel conductive means that is generally perpendicular to and overlapping with the first said plurality of generally parallel conductive means;

a plurality of bits of potential information storage where a bit of said plurality of bits is present in the general vicinity of each point of intersection of each conductive means of the first said plurality of generally parallel conductive means and each conductive means of the second said plurality of generally parallel conductive means, and where the state of any said bit is determined by the presence or absence of a rectifying conductive means at each said general vicinity of said point of intersection;

means for selecting a conductive means of one plurality of generally parallel conductive means, and means for biasing the generally parallel conductive means of the other plurality of generally parallel conductive means such that each said rectifying conductive means present between a conductive means of said biased plurality of generally parallel conductive means and a conductive means of the other said plurality of generally parallel conductive means is potentially forward biased; and means for selecting a biased conductive means by electronically disabling conductive means within said biased plurality of generally parallel conductive means by shifting the voltage of those biased conductive means that are to be disabled;

where at least one of said plurality of generally parallel conductive means is common to more than one said storage means.]

[26. The storage device of claim 25, wherein said means for selecting a conductive means of one plurality of generally parallel conductive means comprises:

means for biasing the generally parallel conductive means of the said one plurality of generally parallel conductive means such that each said rectifying conductive means present between a conductive means of said biased plurality of generally parallel conductive means and a conductive means of the other said plurality of generally parallel conductive means is potentially forward biased; and means for selecting a biased conductive means by electronically disabling conductive means within said biased plurality of generally parallel conductive means by shifting the voltage of those biased conductive means that are to be disabled.]

[27. A semiconductor information storage device comprising:

a plurality of generally parallel conductive means;

a second plurality of generally parallel conductive means that is generally perpendicular to and overlapping with the first said plurality of generally parallel conductive means where one of said two pluralities of generally parallel conductive means is generally a surface layer of the semiconductor; and a plurality of bits of potential information storage where a bit of said plurality of bits is present in the general vicinity of each point of intersection of each conductive means of the first said plurality of generally parallel conductive means and each conductive means of the second said plurality of generally parallel conductive means, and where the state of any said bit is determined by the presence or absence of a rectifying conductive means at each said general vicinity of said point of intersection, and where any said presence or absence of a rectifying conductive means is determined by the leaving in place or the removal, respectively, of a portion of the surface layer conductive means.]

28. An electronic array of selectable points comprising:

a plurality of conductive means;

a second plurality of conductive means;

a plurality of selectable points where a point of said plurality of selectable points is present in the general vicinity of each point of intersection of each conductive means of the first said plurality of conductive means and each conductive means of the second said plurality of conductive means;

means for selecting a conductive means of one plurality of conductive means, and means for biasing the conductive means of the other plurality of conductive means such that each said selectable point present between a conductive means of said biased plurality of conductive means and a conductive means of the other said plurality of conductive means is potentially forward biased; and means for selecting a biased conductive means by electronically disabling conductive means within said biased plurality of conductive means by shifting the voltage of those biased conductive means that are to be disabled.

29. The electronic array of selectable points of claim 28, wherein said means for selecting a conductive means of one plurality of generally parallel conductive means comprises:

means for biasing the conductive means of the said one plurality of conductive means such that each said selectable point present between a conductive means of said biased plurality of conductive means and a conductive means of the other said plurality of conductive means is potentially forward biased; and means for selecting a biased conductive means by electronically disabling conductive means within said biased plurality of conductive means by shifting the voltage of those biased conductive means that are to be disabled.

30. The electronic array of selectable points of claim 28, wherein said each selectable point comprises a light emitting diode (LED) which will emit light when forward biased.

*31. An information-storage circuit, the circuit comprising:*

*first and second sets of conductive lines overlapping with each other and defining storage locations at overlap regions;*

*a pattern of information-defining nonlinear elements, each nonlinear element connected to the first and sec-*

*ond sets of conductive lines at an overlap region, presence or absence of a nonlinear element connection at a storage location defining a bit state at the location; and*

*address circuitry comprising a first pattern of rectifiers directly connected between the first set of conductive lines and a first set of address signal lines, application of an address to the first set of address signal lines causing the first pattern of rectifiers to disable all but one of the first set of conductive lines.*

*32. The circuit of claim 31 further comprising sensing circuitry for sensing the presence or absence of an information-defining nonlinear element connected to the selected one of the first set of conductive lines and at least a selected one of the second set of conductive lines to thereby determine the bit state at each storage location defined by selected conductive lines.*

*33. The circuit of claim 32 wherein the sensing circuitry is configured to sense current when said information-defining nonlinear element is not connected to the selected one of the first set of conductive lines and the selected one of the second set of conductive lines.*

*34. The circuit of claim 33 wherein the sensing circuitry comprises an output line connected to each of the first set of conductive lines by a sensing nonlinear element.*

*35. The circuit of claim 34 wherein the address circuitry comprises a first set of selectable disabling lines fewer in number than and connected to the first set of conductive lines by the first pattern of rectifiers, and circuitry for applying a second voltage to at least some of the first set of disabling lines to thereby disable all but one of the first set of conductive lines, the information-storage circuit further comprising additional address circuitry which itself comprises (i) a second set of selectable disabling lines fewer in number than and connected to the second set of conductive lines by a second pattern of rectifiers, and (ii) circuitry for applying a first voltage to at least some of the second set of disabling lines to thereby disable all but one of the second set of conductive lines, all of the rectifiers having a threshold activation voltage associated therewith, application of the threshold activation voltage across the rectifiers allowing current to flow therethrough.*

*36. The circuit of claim 35 further comprising a first series of voltage-drop elements connecting the first set of conductive lines to a circuitry for applying a first voltage and a second series of voltage drop elements connecting the second set of conductive lines to a circuitry for applying a second voltage.*

*37. The circuit of claim 36 wherein the first and second series of voltage drop elements are resistors.*

*38. The circuit of claim 36 wherein the first and second series of voltage drop elements are nonlinear elements.*

*39. The circuit of claim 38 wherein the nonlinear elements are rectifiers.*

*40. The circuit of claim 39, wherein the first and second sets of conductive lines are disposed on an integrated circuit chip, and the circuitry for applying the first voltage and the circuitry for applying the second voltage are disposed off of the integrated circuit chip and connected thereto.*

*41. The circuit of claim 36 wherein the second voltage is approximately a ground voltage.*

*42. The circuit of claim 32 further comprising a first series of voltage-drop elements connecting the first set of conductive lines to a circuitry for applying a first voltage and a second series of voltage drop elements connecting the second set of conductive lines to a circuitry for applying a second voltage.*

*43. The circuit of claim 42 wherein the first and second series of voltage drop elements are resistors.*

*44. The circuit of claim 42 wherein the first and second series of voltage drop elements are nonlinear elements.*

*45. The circuit of claim 44 wherein the nonlinear elements are rectifiers.*

*46. The circuit of claim 45, wherein the first and second sets of conductive lines are disposed on an integrated circuit chip, and the circuitry for applying the first voltage and the circuitry for applying the second voltage are disposed off of the integrated circuit chip and connected thereto.*

*47. The circuit of claim 42 wherein the second voltage is approximately a ground voltage.*

*48. The circuit of claim 31 wherein the all but one of the first set of conductive lines is disabled by shifting a voltage thereon.*

*49. The circuit of claim 31 further comprising additional address circuitry for disabling all but a selected one of the second set of conductive lines.*

*50. The circuit of claim 49 wherein the all but one of the second set of conductive lines is disabled by shifting a voltage thereon.*

*51. The circuit of claim 49 wherein:*

*the information-defining nonlinear elements have a threshold activation voltage associated therewith;*

*the address circuitry comprises circuitry for setting all but the selected one of the first set of conductive lines to a first voltage; and*

*the additional address circuitry comprises circuitry for setting all but the selected one of the second set of conductive lines to a second voltage, the first and second voltages differing by at least the threshold activation voltage.*

*52. The circuit of claim 51 wherein:*

*the address circuitry further comprises a first set of selectable disabling lines fewer in number than and connected to the first set of conductive lines by the first pattern of rectifiers, and circuitry for applying a third voltage to at least some of the first set of disabling lines to thereby disable all but one of the first set of conductive lines; and*

*the additional address circuitry further comprises a second set of selectable disabling lines fewer in number than and connected to the second set of conductive lines by a second pattern of rectifiers, and circuitry for applying a fourth voltage to at least some of the second set of disabling lines to thereby disable all but one of the second set of conductive lines.*

*53. The circuit of claim 52 wherein the third voltage is substantially equal to the second voltage and the fourth voltage is substantially equal to the first voltage.*

*54. The circuit of claim 53 wherein all of the rectifiers have said threshold activation voltage associated therewith, application of the threshold activation voltage across the rectifiers allowing current to flow therethrough.*

*55. The circuit of claim 54 wherein all of the nonlinear elements are rectifiers having an associated voltage drop corresponding to the threshold activation voltage, the first and second voltages differing by at least the rectifier voltage drop.*

*56. The circuit of claim 51 wherein the information-defining nonlinear elements are rectifiers having an associated voltage drop corresponding to the threshold activation voltage, the first and second voltages differing by at least the rectifier voltage drop so that an information-defining rectifier, if connected to the selected conductive lines, is forward biased.*

*57. The circuit of claim 51 wherein the second voltage is approximately a ground voltage.*

*58. The circuit of claim 31 further comprising a first series of voltage-drop elements connecting the first set of conductive lines to a circuitry for applying a first voltage and a second series of voltage drop elements connecting the second set of conductive lines to a circuitry for applying a second voltage.*

*59. The circuit of claim 58 wherein the first and second series of voltage drop elements are resistors.*

*60. The circuit of claim 58 wherein the first and second series of voltage drop elements are nonlinear elements.*

*61. The circuit of claim 60 wherein the nonlinear elements are rectifiers.*

*62. The circuit of claim 61, wherein the first and second sets of conductive lines are disposed on an integrated circuit chip, and the circuitry for applying the first voltage and the circuitry for applying the second voltage are disposed off of the integrated circuit chip and connected thereto.*

*63. The circuit of claim 58 wherein the second voltage is approximately a ground voltage.*

*64. The circuit of claim 31 wherein the circuit operates as a random access memory.*

*65. The circuit of claim 31 wherein the circuit operates as a read only memory.*

*66. The circuit of claim 31 wherein the circuit operates as a one-time-programmable read only memory.*

* * * * *